(12) United States Patent
Jeong

(10) Patent No.: US 11,978,520 B2
(45) Date of Patent: May 7, 2024

(54) METHOD OF ERASING FLASH MEMORY AND ELECTRONIC SYSTEM

(71) Applicant: WUHAN XINXIN SEMICONDUCTOR MANUFACTURING CO., LTD., Hubei (CN)

(72) Inventor: Jong Bae Jeong, Hubei (CN)

(73) Assignee: WUHAN XINXIN SEMICONDUCTOR MANUFACTURING CO., LTD., Hubei (CN)

( * ) Notice: Subject to any disclaimer, the term of this patent is extended or adjusted under 35 U.S.C. 154(b) by 202 days.

(21) Appl. No.: 17/566,253

(22) Filed: Dec. 30, 2021

(65) Prior Publication Data

US 2022/0383964 A1 Dec. 1, 2022

(30) Foreign Application Priority Data

May 28, 2021 (CN) .......................... 202110591334.0

(51) Int. Cl.
| | |
|---|---|
| *G11C 16/34* | (2006.01) |
| *G11C 16/10* | (2006.01) |
| *G11C 16/14* | (2006.01) |
| *G11C 16/26* | (2006.01) |

(52) U.S. Cl.
CPC ........ *G11C 16/3445* (2013.01); *G11C 16/102* (2013.01); *G11C 16/14* (2013.01); *G11C 16/26* (2013.01); *G11C 16/345* (2013.01)

(58) Field of Classification Search
CPC ............ G11C 2216/18; G11C 16/3445; G11C 16/102; G11C 16/14; G11C 16/26; G11C 16/345; G11C 16/16; G11C 16/344; G11C 16/3468
See application file for complete search history.

(56) References Cited

U.S. PATENT DOCUMENTS

| | | | | |
|---|---|---|---|---|
| 2011/0145483 | A1* | 6/2011 | Sudo | .................. G06F 12/0246 711/E12.001 |
| 2013/0100737 | A1 | 4/2013 | Kwak | |

FOREIGN PATENT DOCUMENTS

| | | |
|---|---|---|
| CN | 101552037 A | 10/2009 |
| CN | 103426474 A | 12/2013 |
| CN | 104751887 A | 7/2015 |
| CN | 104751888 A | 7/2015 |
| CN | 112397128 A | 2/2021 |

\* cited by examiner

*Primary Examiner* — Alfredo Bermudez Lozada
(74) *Attorney, Agent, or Firm* — MUNCY, GEISSLER, OLDS & LOWE, PC

(57) ABSTRACT

Each memory block in the flash memory is added with corresponding information bit(s) that store(s) information indicating whether erasure of the memory block has been completed before power-off. This allows easily finding out which memory block in the flash memory is undergoing an erase operation at the time of power-off. When the flash memory is powered on again, the information in the corresponding information bit(s) of the memory blocks may be read out and checked to determine whether there is any memory block of which the erasure had not been completed before the last power-off. If so, the memory blocks in the flash memory will be reprogrammed during the re-powering. This can avoid possible failure in reading data from some memory cells in the flash memory.

14 Claims, 3 Drawing Sheets

METHOD OF ERASING FLASH MEMORY AND ELECTRONIC SYSTEM

CROSS-REFERENCES TO RELATED APPLICATION

This application claims the priority of Chinese patent application number 202110591334.0, filed on May 28, 2021, the entire contents of which are incorporated herein by reference.

TECHNICAL FIELD

The present invention relates to the field of flash memory technology, and more particularly to a flash memory, a method of erasing the flash memory and an electronic system.

BACKGROUND

Flash memory is a type of non-volatile memory (capable of retaining stored data and information even after power is removed) that has a long service life. Its main component is an array of memory cells making up memory blocks each containing a plurality of memory cells. These blocks are generally arranged in a single well and share a common bit line.

SUMMARY OF THE INVENTION

It is an objective of the present invention to provide a flash memory, a method of erasing the flash memory and an electronic system, which overcome the above-described problem that the reading of data from some memory cells of a flash memory that is re-powered up may fail.

This objective is attained by a flash memory provided in the present invention, which includes a plurality of memory blocks and information bits each corresponding with a respective one of the memory blocks and storing information indicating of whether erasure of the memory block is completed prior to power-off.

Optionally, each of the memory blocks may include a plurality of memory cells, wherein the information stored in the information bit(s) is read when the flash memory is re-powered up.

Optionally, each information bit may be one bit storing one-bit data indicating whether erasure of the corresponding memory block is completed prior to power-off. Alternatively, each information bit(s) may include multiple bits storing multi-bit data indicating whether erasure of the corresponding memory block is completed prior to power-off.

Based on the same inventive concept, the present invention also provides a method of erasing a flash memory. The flash memory includes a plurality of memory blocks and the information bit(s) each corresponding with a respective one of the memory blocks, and each memory block includes a plurality of memory cells. Each information bit stores information indicating of whether erasure of the respective corresponding memory block is completed prior to power-off, and the method includes block-wise erasing the memory blocks in the order of numbering thereof. The erasure of each memory block includes the steps of:

preprogramming all the memory cells in the memory block;

erasing the corresponding information bit(s) of the memory block and erasing all the memory cells in the memory block by an erase verify operation;

performing an over-erase correction operation on all the memory cells in the memory block;

reprogramming the other memory blocks in the flash memory than the specific memory block by a program verify operation; and subsequent to the reprogramming, programming the corresponding information bit(s) of the memory block, causing it to indicate that the memory block has been erased prior to power-off.

Optionally, the method may further include, when the flash memory is re-powered up, reading the information stored in the corresponding information bit(s) of the memory blocks, checking on the basis of the read information whether there is incomplete erasure of any memory block in the flash memory prior to the re-powering, and if there is, reprogramming the memory blocks and the corresponding information bit(s) thereof.

Optionally, during the re-powering, information stored in the corresponding information bit(s) of the memory blocks may be read block-wise in the order of numbering thereof, wherein, for each of the memory blocks, after the information stored in the corresponding information bit(s) is read, it is determined whether the information indicates incomplete erasure of the memory block prior to power-off, and if so, the memory blocks and their corresponding information bit(s) are reprogrammed.

Optionally, each information bit may be one bit storing one-bit data indicating whether erasure of the corresponding memory block is completed prior to power-off. Alternatively, each information bit may include multiple bits storing multi-bit data indicating whether erasure of the corresponding memory block is completed prior to power-off.

Based on the same inventive concept, the present invention also provides an electronic system including a flash memory and an operational module for erasing the flash memory. The flash memory includes a plurality of memory blocks and information bit(s) each corresponding with a respective one of the memory blocks. Each memory block includes a plurality of memory cells, and each information bit stores information indicating of whether erasure of the respective corresponding memory block is completed prior to power-off. The operational module is coupled to the flash memory and includes:

a preprogramming block configured to preprogram all the memory cells in a memory block of the flash memory;

an erasing block configured to erase the corresponding information bit(s) of the memory block and perform an erase verify operation for erasing all the memory cells in the memory block that has been preprogrammed by the preprogramming block;

an over-erase correction block configured to perform an over-erase correction operation on all the memory cells in the memory block that has been erased by the erasing block; and a reprogramming block configured to reprogram, by a program verify operation, the other memory blocks than the erased memory block that has undergone the over-erase correction operation performed by the over-erase correction block and to program the corresponding information bit(s) of the memory block subsequent to the reprogramming to cause it to indicate that the memory block has been erased prior to power-off.

Optionally, the operational module may further include an information reading and checking block configured to, when the flash memory is re-powered up, read the information stored in the corresponding information bit(s) of the memory blocks, check on the basis of the read information whether there is incomplete erasure of any memory block in the flash memory prior to the re-powering, and if there is, reprogram the memory blocks and the corresponding information bit(s) thereof.

Compared with the prior art, the present invention has at least one of the following advantages:

1. In the flash memory, each memory block is added with a corresponding information bit(s) that stores information indicating whether erasure of the memory block has been completed prior to power-off. This allows easily finding out which memory block in the flash memory is undergoing an erase operation at the time of power-off (i.e., easily identifying the memory block to which block-wise erasure of the flash memory proceeds at the time of sudden power-off).

2. When accidental power-off occurs during the erasure of any memory block in the flash memory and makes the erasure of the memory block incomplete, the information stored in the information bit(s) corresponding with the memory block will be configured to be different from that for the other memory blocks. Specifically, the information stored in the corresponding information bit(s) of the incompletely erased memory block may be erased (i.e., not programmed; configured with the value "0", for example), while the information stored in the corresponding information bit(s) of the other memory blocks may not be erased (i.e., programmed; configured with the value "1", for example). In this way, when the flash memory is re-powered up, through reading the information in the corresponding information bit(s) of the memory blocks, it will be easy to identify the memory block of which the erasure was not completed prior to the last power-off. Accordingly, during the re-powering of the flash memory, the memory blocks may be reprogrammed, avoiding possible failure in reading data from some memory cells in the flash memory caused by lowering of threshold voltages (Vt) of these memory cells under the effect of erase stress occurring during previous block-wise erasure of some memory block.

DETAILED DESCRIPTION

The present invention will be described in greater detail below by way of particular embodiments with reference to the accompanying drawings. Advantages and features of the present invention will become more apparent from the following description. Note that the figures are provided in a very simplified form not necessarily drawn to exact scale for the only purpose of helping to explain the embodiments disclosed herein in a more convenient and clearer way.

Figure 1:
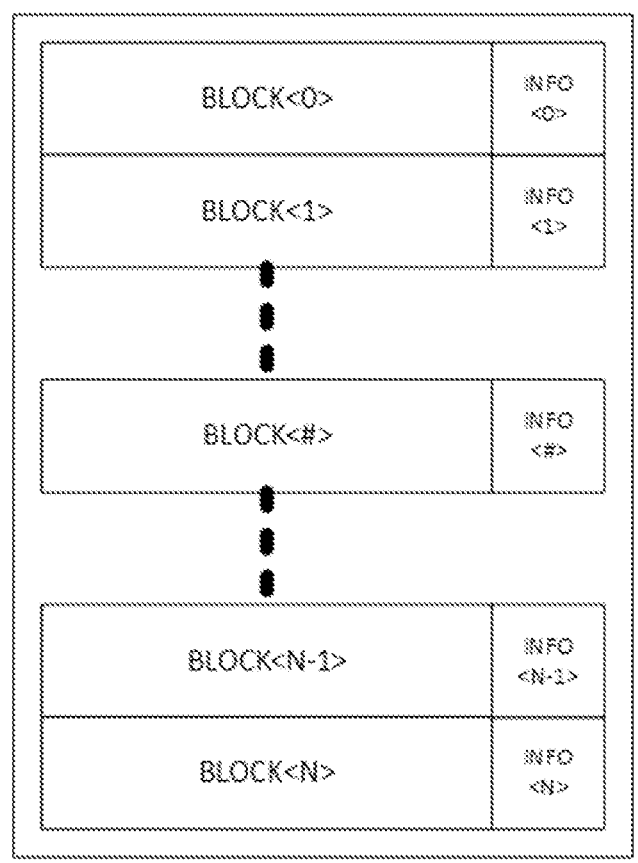
FIG. 1 schematically illustrates a block-wise arrangement of a memory array of a flash memory according to an embodiment of the present invention.

Referring to FIG. 1, a flash memory provided in an embodiment of the present invention includes N+1 memory blocks BLOCK<0>-BLOCK<N> and information bit(s) INFO each corresponding with a respective one of the memory blocks BLOCK. Each of the memory blocks BLOCK includes a plurality of memory cells, and the corresponding information bit(s) INFO of each memory block BLOCK stores information indicating whether erasure of the memory block BLOCK has been completed before power-off (i.e., whether the memory block BLOCK is undergoing an erase operation that is interrupted due to power-off). N is a natural number, and the N+1 memory blocks BLOCK<0>-BLOCK<N> may be formed in the same well and share a common bit line.

As an example, an information bit INFO having the value "0" (i.e., INFO=0) may indicate incomplete erasure of the corresponding memory block BLOCK prior to power-off (i.e., the erasure may resume in one of steps S21-S23 as detailed below). In contrast, an information bit INFO having the value "1" (i.e., INFO=1) may indicate complete erasure of the corresponding memory block BLOCK prior to power-off. Obviously, during block-wise erasure of the flash memory, if information of the corresponding information bit(s) INFO<#> of any memory block BLOCK<#> indicates the value "0", then it is indicated that the erasure of the flash memory has proceeded to this memory block BLOCK<#> and the memory block BLOCK<#> is now being erased. Therefore, in the event of (sudden) power-off during the block-wise erasure of the flash memory, the memory block BLOCK to which the erasure process proceeds and of which the erasure is not complete yet can be simply identified by finding out the one of the memory blocks BLOCK of which the corresponding information bit(s) INFO assumes "0".

In this embodiment, the memory block BLOCK<0> corresponds to the information bit(s) INFO<0> storing information indicative of whether erasure of the memory block BLOCK<0> has been completed or not before the memory is powered off; the memory block BLOCK<1> is corresponding with the information bit(s) INFO<1> storing information indicative of whether erasure of the memory block BLOCK<1> has been completed or not before the memory is powered off; the memory block BLOCK<2> is corresponding with the information bit(s) INFO<2> storing information indicative of whether erasure of the memory block BLOCK<2> has been completed or not before the memory is powered off; . . . ; the memory block BLOCK<#> is corresponding with the information bit(s) INFO<#> storing information indicative of whether erasure of the memory block BLOCK<#> has been completed or not before the memory is powered off; . . . ; and the memory block BLOCK<N> is corresponding with the information bit(s) INFO<N> storing information indicative of whether erasure of the memory block BLOCK<N> has been completed or not before the memory is powered off.

Optionally, upon the flash memory being re-powered up, all the information stored in the information bits INFO<0>-INFO<N> may be read and checked to determine whether it is necessary to reprogram all the memory blocks (i.e., all the memory cells) in the flash memory.

Each of the information bits INFO<0>-INFO<N> may be one bit. In this case, for each of the memory blocks BLOCK<0>-BLOCK<N>, the information indicating whether its erasure is complete before power-off is one-bit data. Alternatively, each of the information bits INFO<0>-INFO<N> may include multiple bits. In this case, for each of the memory blocks BLOCK<0>-BLOCK<N>, the information indicating whether its erasure is complete prior to power-off is multi-bit data.

Figure 2:
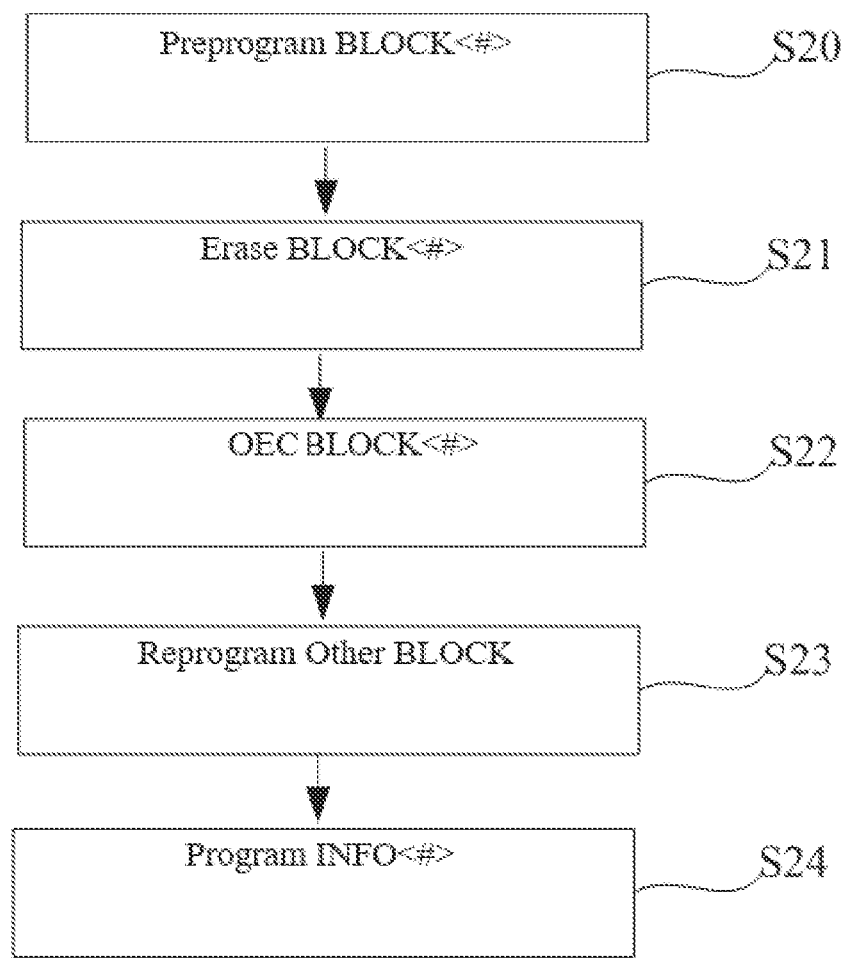
FIG. 2 is a flowchart of a method of erasing the flash memory according to an embodiment of the present invention.

Referring to FIGS. 1 and 2, the present invention also provides a method of erasing the flash memory shown in FIG. 1, which includes N+1 memory blocks BLOCK<0>-BLOCK<N> and information bits INFO<0>-INFO<N> each corresponding to a respective one of the memory block BLOCK<0>-BLOCK<N>. Each of the memory blocks BLOCK<0>-BLOCK<N> includes a plurality of memory cells, and the corresponding information bit(s) INFO<0>-INFO<N> of each memory block stores information indicating whether erasure of the memory block has been completed prior to power-off. The method of the invention involves erasing the memory blocks BLOCK<0>-BLOCK<N> one by one in the ascending order of their indices from BLOCK<0>-BLOCK<N> or in the descending order of their indices from BLOCK<N>-BLOCK<0>. The steps for erasing each memory block BLOCK<#> (0≤#≤N) are as follows.

S20: Preprogram all the memory cells in the memory block BLOCK<#> ("Preprogram BLOCK<#>"). This typically involves programming all the memory cells in the memory block BLOCK<#> at a predetermined electrical level so that there is a substantially equal amount of charge in the floating gate of each memory cell in the memory block BLOCK<#>.

S21: Erase the information bit(s) INFO<#> of the memory block BLOCK<#> ("Erase INFO<#>") and erase all the memory cells in the memory block BLOCK<#> ("Erase BLOCK<#>") by an erase verify operation. One example of the erase verify operation involves, with an erase pulse applied to the memory block BLOCK<#>, erasing and verifying the memory cells in the memory block BLOCK<#> row by row. That is, only when all the memory cells in the current row of the memory block BLOCK<#> have been erased and verified to be properly erased, will the operation proceed to the next row for erasure and verification of memory cells therein. In this way, at the end of the operation, all the memory cells in the memory block BLOCK<#> will be erased and verified to be properly erased. Another example of the erase verify operation involves erasing all the memory cells in the memory block BLOCK<#> with an erase pulse and then performing a verify operation to find whether they are properly erased. This can also ensure erasure of all the memory cells in the memory block BLOCK<#>.

S22: Perform an over-erase correction (OEC) operation ("OEC of BLOCK<#>") on all the memory cells in the memory block BLOCK<#>, which involves programming all over-erased memory cells in the memory block BLOCK<#> (also known as threshold voltage (Vt) distribution soft-programming) by checking the current level of the column (bit line) of the memory block BLOCK<#> to find if any over-erased memory cell in the memory block BLOCK<#> is coupled to the bit line. If so, a program pulse to be used in the over-erase correction operation is systematically applied to control gate(s) of the memory cell(s) coupled to the bit line until no current can be detected. In this way, leakage current is eliminated from the bit line for the memory block BLOCK<#>.

S23: Reprogram the other memory blocks BLOCK<0>-BLOCK<#-1> and BLOCK<#+1>-BLOCK<N> in the flash memory than the memory block BLOCK<#> by a program verify operation ("Reprogram Other BLOCK"), avoiding the erasure of the memory block BLOCK<#> from affecting any other memory block. Likewise, the other memory blocks are reprogrammed block-wise. For each of the other memory blocks BLOCK, one example of the program verify operation involves, for each row of memory cells in the memory block BLOCK, reading data stored therein and verifying whether the data is correct. If not, the memory cells are reprogramed with correct data. For each row, only when all its memory cells have been verified to be properly programmed, will the operation proceed to the next row for programming and verification of memory cells therein. In this way, it can be ensured that data stored in all the memory cells in the other memory blocks BLOCK<0>-BLOCK<#-1> and BLOCK<#+1>-BLOCK<N> is not erased.

S24: Subsequent to the reprogramming (i.e., all the other memory blocks BLOCK<0>-BLOCK<#-1> and BLOCK<#+1>-BLOCK<N> in the flash memory have been verified to be properly programmed), program the corresponding information bit(s) INFO<#> of the memory block BLOCK<#> ("Program INFO") so that the information therein indicates that erasure of the memory block BLOCK<#> has been completed prior to power-off, i.e., the memory block BLOCK<#> is erased before the memory is powered down.

With "INFO=" and "INFO=1" indicating incomplete and complete erasure of the corresponding memory blocks BLOCK before the power-off respectively, during block-wise erasure of the flash memory in the ascending order from 0 to N, if power-off occurs when one of the memory blocks BLOCK<#> is being erased, then INFO<#>=0, and INFO<0>-INFO<#-1> and INFO<#+1>-INFO<N> all are "1". INFO<0>-INFO<#-1>=1 indicates that erasure of the memory blocks BLOCK<0>-BLOCK<#-1> has been completed prior to the power-off, while INFO<#+1>-INFO<N>=1 indicates that erasure of the memory blocks BLOCK<#+1>-BLOCK<N> has not begun yet prior to the power-off.

Therefore, according to the present invention, during the process of by block erase of the flash memory, once (suddenly) power off (power down), it is easy to find out which memory block Block was operating the block-wise erase and the erase of the memory block Block was not completed by finding out the one of the memory blocks BLOCK of which the information bit(s) INFO was (assumed) "0".

Accordingly, in the method of the present invention, once the flash memory power down while one of the memory blocks BLOCK<#> was being erased, when the flash memory is re-powered up (or powered on again), information stored in the corresponding information bits INFO<0>-INFO<N> of the memory blocks BLOCK<0>-BLOCK<N> will be read first to check (i.e., determine) whether there is any memory block in the flash memory of which the erasure was not completed last time. If so, the memory blocks BLOCK<0>-BLOCK<N> and the respective corresponding information bits INFO<0>-INFO<N> should be reprogramed during the re-powering of the flash memory in order to ensure that data can be correctly read out from the memory cells in the re-powered flash memory.

Figure 3:
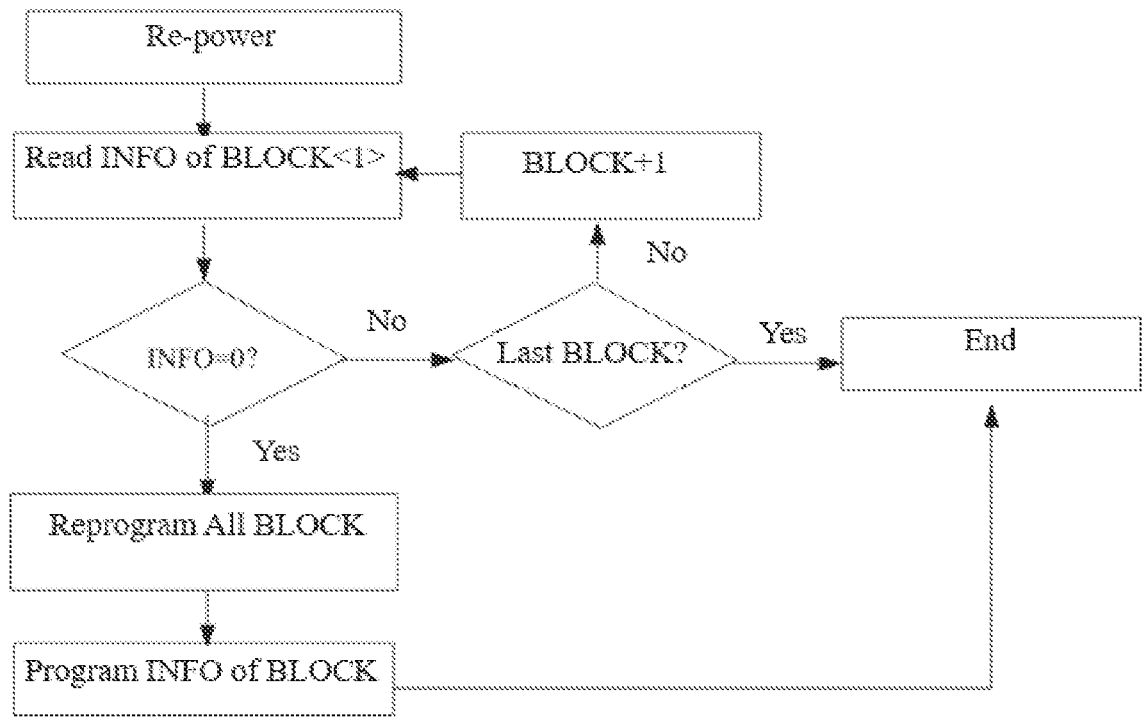
FIG. 3 is a flowchart of a process performed in the method when the flash memory is re-powered up from the last power-off that occurred during the erasure of some memory block in the flash memory according to a particular embodiment of the present invention.

FIG. 3 shows a process carried out during the re-powering of the flash memory in this embodiment. The process begins with block-wise reading of information stored in the corresponding information bits INFO<0>-INFO<N> of the memory blocks BLOCK<0>-BLOCK<N> in the ascending order of the indices of the memory blocks BLOCK<0>-BLOCK<N> from 0 to N. Following the reading of the information stored in the corresponding information bits INFO<0>-INFO<N> of each memory block BLOCK<0>-BLOCK<N>, it is determined whether the information stored in the information bit indicates incomplete erasure of the corresponding memory block before the last power-off. If so, the memory blocks BLOCK<0>-BLOCK<N> and the corresponding information bits INFO<0>-INFO<N> should be reprogrammed during the re-powering. For example, after the information stored in the corresponding information bit(s) INFO<#> of a memory block BLOCK<#> is read out during the power on period, it is determined whether the information read out from the information bit(s) INFO<#> is indicative of the value "0" ("0" indicates incomplete erasure of the memory block BLOCK<#> prior to the last power-off, while "1" indicates that erasure of the memory block BLOCK<#> has been completed or has not begun yet before the last power-off). If not ("No"), the information stored in the corresponding information bit(s) INFO<#+1> of the next memory block BLOCK<#+1> will be read out, and this is repeated until it is found that the information stored in the corresponding information bit(s) of one of the memory blocks indicates the value "0", or that no information in the information bits indicates "0" (i.e., all of them indicate the value "1"). If so ("Yes"), the memory blocks BLOCK<0>-BLOCK<N> are reprogrammed, and the respective corresponding information bits INFO<0>-INFO<N> are all reprogrammed to indicate "1".

Figure 4:
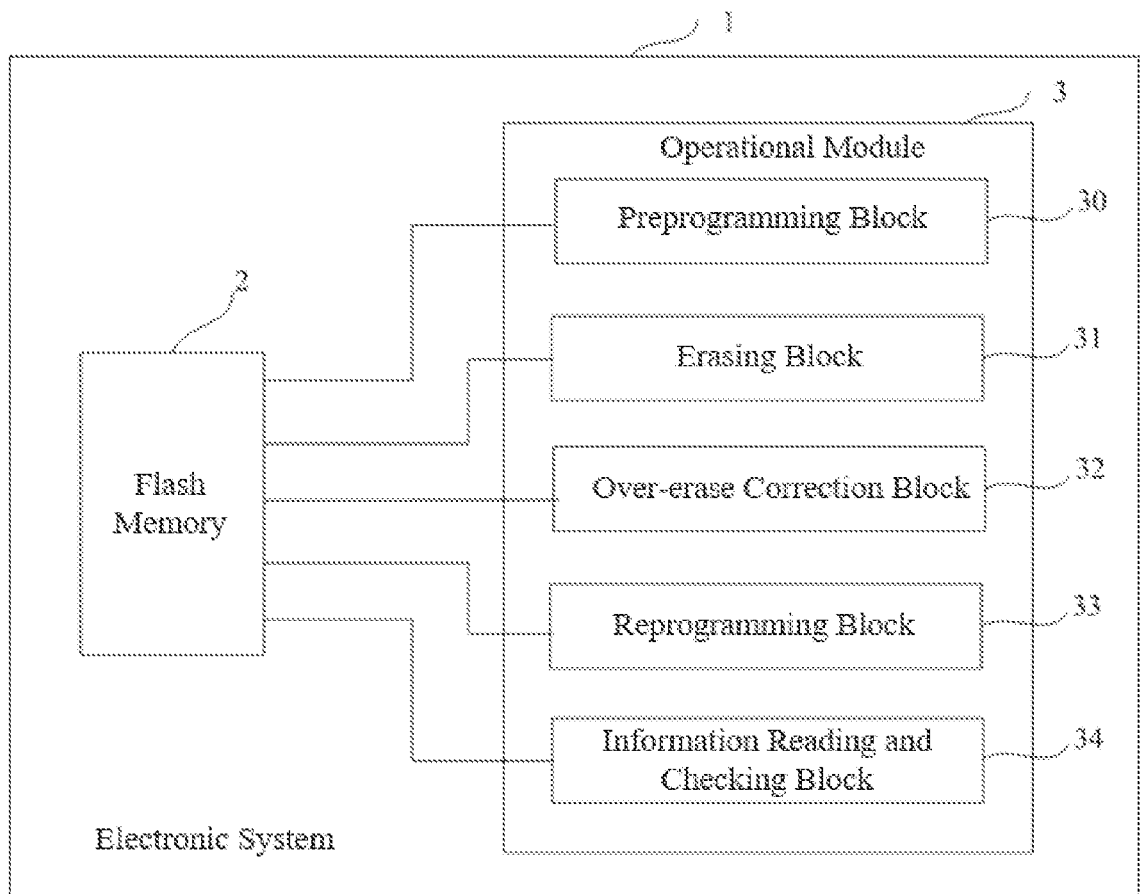
FIG. 4 schematically illustrates the architecture of an electronic system according to a particular embodiment of the present invention.

It is to be noted that erasure of the memory block BLOCK<#> in the above method begins in step S21, and S20 is a preliminary step for the erasure of the memory block BLOCK<#>. Therefore, the erasure of the information bit INFO<#> in step S21 can be performed either before or after step S20 or in the middle of step S20 as long as it is completed before the beginning of reprogramming the other memory blocks BLOCK<0>-BLOCK<#−1> and BLOCK<#+1>-BLOCK<N> than the memory block BLOCK<#> ("Reprogram Other BLOCK"). When the erasure of the information bit(s) INFO<#> is performed after step S20, it may precede the erasure of all the memory cells in the memory block BLOCK<#>, or follow the erasure and verification of some memory cells in the memory block BLOCK<#>, or follow the erasure and verification of all the memory cells in the memory block BLOCK<#> and precede the reprogramming the first one of the other memory blocks BLOCK<0>-BLOCK<#−1> and BLOCK<#+1>-BLOCK<N> than the memory block BLOCK<#> ("Reprogram Other BLOCK"). In the case of the erasure of the corresponding information bit(s) INFO<#> of the memory block BLOCK<#> preceding the erase verify operation on the memory cells in the memory block BLOCK<#>, if the information bit(s) INFO<#> includes multiple bits (storing multi-bit data that indicates whether erasure of the memory block BLOCK<#> had been completed prior to the last power-off), the corresponding information bit(s) INFO<#> of the memory block BLOCK<#> will be considered to be properly erased only when data of all the bits of the information bit(s) INFO<#> has been erased. Only in this situation, the erase verify operation on the first memory cell in the memory block BLOCK<#> will be excluded. Based on the same inventive concept, in embodiments of the present invention, there is also provide an electronic system 1 including a flash memory 2 and an operational module 2 for erasing the flash memory 1, as shown in FIG. 4.

The flash memory 2 is the one shown in FIG. 1, which includes N+1 memory blocks BLOCK<0>-BLOCK<N> and information bits INFO<0>-INFO<N> each corresponded with a respective one of the memory blocks BLOCK<0>-BLOCK<N>. Each of the memory blocks BLOCK<0>-BLOCK<N> includes a plurality of memory cells, and each of the information bits INFO<0>-INFO<N> stores information indicating whether erasure of the corresponding memory block BLOCK has been completed prior to power-off.

The operational module 3 is coupled to the flash memory 2 and is configured to execute the above erasing method of the present invention. Specifically, the operational module 3 includes a preprogramming block 30, an erasing block 31, an over-erase correction block 32, a reprogramming block 33 and an information reading and checking block 34.

The preprogramming block 30 is configured to preprogram all the memory cells in a memory block of the flash memory 2, i.e., perform step S20 as described above.

The erasing block 31 is configured to erase an information bit corresponding with the memory block and perform an erase verify operation for erasing all the memory cells in the memory block that has been preprogrammed by the preprogramming block 30, i.e., perform step S21 as described above. The over-erase correction block 32 is configured to perform an over-erase correction operation on all the memory cells in the memory block that has been erased by the erasing block 31, i.e., perform step S22 as described above.

The reprogramming block 33 is configured to reprogram, by a program verify operation, the other memory blocks than the erased memory block that has completed the over-erase correction operation performed by the over-erase correction block 32 and to reprogram the corresponding information bit(s) of the erased memory block subsequent to the reprogramming of the other memory blocks in the flash memory 2 so that the reprogrammed information bit(s) indicates that the corresponding memory block has been erased prior to power-off, i.e., perform steps S23-S24 as described above.

The information reading and checking block 34 is configured to, during re-powering of the flash memory 2, read information stored in the corresponding information bit(s) INFO<0>-INFO<N> of the memory block BLOCK<0>-BLOCK<N> and check the read information to find whether there is any memory block of which the erasure has not been completed before the re-powering of the flash memory 2. If there exists one, it is further configured to reprogram the memory blocks BLOCK<0>-BLOCK<N> and the corresponding information bit(s) INFO<0>-INFO<N> thereof during the re-powering of the flash memory 2.

It is to be noted that the erasure of the information bit(s) of the memory block by the erasing block 31 can be performed either before or after the preprogramming block 30 preprograms all the memory cells in the memory block as long as it is completed before the completion of the program verify operation by the reprogramming block 33 for reprogramming the other memory blocks in the flash memory 2 than the erased memory block. As an example, the erasure of the information bit(s) of the memory block performed by the erasing block 31 may follow the preprogramming of all the memory cells in the memory block performed by the preprogramming block 30 and precede the erase verify operation performed by the erasing block 31 on the first memory cell in the memory block. It would be appreciated that the preprogramming block 30, the erasing block 31, the over-erase correction block 32, the reprogramming block 33 and the information reading and checking block 34 in the operational module 3 may be integrated in a single device, or any of them may be separated into multiple devices, or at least part of the functionality of one or more of them may be combined with at least part of the functionality of one or more other apparatuses into a single device. According to embodiments of the present invention, at least one of the reprogramming block 30, the erasing block 31, the over-erase correction block 32, the reprogramming block 33 and the information reading and checking block 34 may be implemented at least partially in hardware circuitry such as, for example, field programmable gate arrays (FPGAs), programmable logic arrays (PLAs), on-chip systems, on-substrate systems, on-package systems, application specific integrated circuits (ASICs), or in hardware or firmware in any other reasonable form capable of circuit integration or packaging, or in suitable combinations of software, hardware and firmware. Alternatively, at least one of the reprogramming block 30, the erasing block 31, the over-erase correction block 32, the reprogramming block 33 and the information reading and checking block 34 may be implemented at least partially as computer program modules which, when executed by a computer, perform corresponding functions.

Based on the same inventive concept, in embodiments of the present invention, there is also provided a computer storage medium storing thereon a computer program, which may include codes/computer executable instructions and, when executed by a processor, carries out the above-described method or any variation thereof. The computer storage medium may be any medium capable of embodying, storing, transmitting, propagating or communicating instructions. For example, the computer storage medium may include, but is not limited to, an electronic, magnetic, optical, electromagnetic, infrared or semiconductor system, apparatus, device, or propagation medium. More specific examples of the computer storage medium may include a magnetic storage device such as a magnetic tape or a hard disk drive (HDD), an optical storage device such as a compact disc read-only memory (CD-ROM), a memory such as a random access memory (RAM) or a USB flash drive, and/or a wired/wireless communication link.

In the flash memory, the method and the electronic system provided in the present invention, each memory block in the flash memory is added with a corresponding information bit that stores information indicating whether erasure of the memory block has been completed prior to power-off. This allows easily finding out which memory block in the flash memory is undergoing an erase operation at the time of power-off. When erasure of any memory block in the flash memory becomes incomplete because power is lost during the erasure, information indicating that the erasure of the memory block is not completed yet prior to the power-off will be stored in the corresponding information bit(s), and information will be also stored in the corresponding information bit(s) of each other memory block, which indicates that erasure of the specific memory block has been completed or has not begun yet. In this way, when the flash memory is powered on again, the information in the corresponding information bit(s) of the memory blocks will be read out and checked to determine whether there is any memory block of which the erasure had not been completed prior to the last power-off. If so, the memory blocks in the flash memory will be reprogrammed during the re-powering. This can avoid possible failure in reading data from some memory cells in the flash memory caused by lowering of threshold voltages (Vt) of these memory cells under the effect of erase stress occurring during previous block-wise erasure of some memory block.

The foregoing description presents merely preferred embodiments of the present invention and is not intended to limit the scope of the present invention in any sense. It is intended that all changes and modifications made by those of ordinary skill in the art in light of the above teachings fall within the scope of the appended claims.

What is claimed is:

1. A method of erasing a flash memory, the flash memory comprising a plurality of memory blocks and information bits each corresponding with a respective one of the plurality of memory blocks, each memory block comprising a plurality of memory cells, each information bit storing information indicating whether erasure of the respective corresponding memory block is completed prior to power-off, the method comprising block-wise erasing the plurality of memory blocks in an order of numbering thereof, the erasure of each memory block comprising the steps of:
   preprogramming all the memory cells in the memory block;
   erasing the corresponding information bit(s) of the memory block and erasing all the memory cells in the memory block by an erase verify operation;
   performing an over-erase correction operation on all the memory cells in the memory block;
   reprogramming the other memory blocks in the flash memory than the specific memory block by a program verify operation; and
   subsequent to the reprogramming, programming the corresponding information bit(s) of the memory block to indicate that the memory block has been erased prior to power-off.

2. The method of claim 1, further comprising, when the flash memory is re-powered up, reading the information stored in the corresponding information bit(s) of the plurality of memory blocks, checking on the basis of the read information whether there is a memory block in the flash memory that has not completed the erasure before the re-powering, and if there is, reprogramming the plurality of memory blocks and the corresponding information bit(s) of the memory block.

3. The method of claim 2, wherein during the re-powering, information stored in the corresponding information bit(s) of the plurality of memory blocks is read out block-wise in the order of the block numbering thereof, and wherein, for each of the plurality of memory blocks, after the information stored in the corresponding information bit(s) is read out, it is determined whether the information indicates incomplete erasure of the memory block prior to power-off, and if so, the plurality of memory blocks and their corresponding information bit(s) are programmed again.

4. The method of claim 1, wherein block-wise erasing the plurality of memory blocks in an order of numbering thereof comprises erasing the plurality of memory blocks one by one in an ascending order of numbering thereof or in a descending order of numbering thereof.

5. The method of claim 1, wherein preprogramming all the memory cells in the memory block comprises setting all the memory cells in the memory block to a predetermined electrical level so that there is a substantially equal amount of charge in a floating gate of each memory cell in the memory block.

6. The method of claim 1, wherein for each memory block, after all the memory cells in the memory block are preprogrammed, the corresponding information bit(s) is erased, and all the memory cells in the memory block are then erased by an erase verify operation.

7. The method of claim 6, wherein the erase verify operation involves applying an erase pulse applied to the memory block, erasing and verifying all the memory cells in the memory block row by row.

8. The method of claim 6, wherein the erase verify operation involves erasing all the memory cells in the memory block with an erase pulse and then performing a verify operation to find whether all the memory cells in the memory block are properly erased.

9. The method of claim 1, wherein the erasure of the corresponding information bit(s) of the memory block is performed either before or after the preprogramming of all the memory cells in the memory block.

10. An electronic system, comprising a flash memory and an operational module for erasing the flash memory, the flash memory comprising a plurality of memory blocks and information bits each corresponding with a respective one of the plurality of memory blocks, each memory block comprising a plurality of memory cells, each information bit storing information indicating of whether erasure of the corresponding memory block is completed prior to power-off, the operational module coupled to the flash memory, the operational module comprising:
   a preprogramming block configured to preprogram all the memory cells in a memory block of the flash memory;
   an erasing block configured to erase the corresponding information bit(s) of the memory block and perform an erase verify operation for erasing all the memory cells in the memory block that has been preprogrammed by the preprogramming block;
   an over-erase correction block configured to perform an over-erase correction operation on all the memory cells in the memory block that has been erased by the erasing block; and
   a reprogramming block configured to reprogram, by a program verify operation, the other memory blocks than the erased memory block that has completed the over-erase correction operation performed by the over-erase correction block and to program the corresponding information bit(s) of the memory block subsequent to the reprogramming to indicate that the memory block has been erased prior to power-off.

11. The electronic system of claim 10, wherein the operational module further comprises an information reading and checking block configured to, when the flash memory is re-powered up, read the information stored in the corresponding information bit(s) of the plurality of memory blocks, check on the basis of the read information whether there a memory block in the flash memory that has not completed the erasure before the re-powering, and if there is, reprogram the plurality of memory blocks and the corresponding information bit(s) thereof.

12. The electronic system of claim 11, wherein the preprogramming block, the erasing block, the over-erase correction block, the reprogramming block and the information reading and checking block in the operational module are integrated in a single device.

13. The electronic system of claim 10, wherein preprogramming all the memory cells by the preprogramming block comprises setting all the memory cells in the memory block to a predetermined electrical level so that there is a substantially equal amount of charge present on a floating gate of each memory cell in the memory block.

14. The electronic system of claim 10, wherein the erasure of the information bit(s) of the memory block by the erasing block is performed either before or after the preprogramming block preprograms all the memory cells in the memory block of the flash memory.

* * * * *